United States Patent
Kurashige (10) Patent No.: US 10,520,596 B2
(45) Date of Patent: Dec. 31, 2019

(54) FM-CW RADAR AND METHOD OF GENERATING FM-CW SIGNAL

(71) Applicant: Mitsubishi Electric Corporation, Chiyoda-ku (JP)

(72) Inventor: Kazunori Kurashige, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 179 days.

(21) Appl. No.: 15/549,477

(22) PCT Filed: Feb. 19, 2015

(86) PCT No.: PCT/JP2015/054687
§ 371 (c)(1),
(2) Date: Aug. 8, 2017

(87) PCT Pub. No.: WO2016/132520
PCT Pub. Date: Aug. 25, 2016

(65) Prior Publication Data
US 2018/0031691 A1   Feb. 1, 2018

(51) Int. Cl.
*G01S 13/58*  (2006.01)
*G01S 7/40*   (2006.01)

(52) U.S. Cl.
CPC .......... *G01S 13/584* (2013.01); *G01S 7/4004* (2013.01)

(58) Field of Classification Search
CPC .. G01S 13/584; G01S 13/345; H03M 1/1038; H03L 7/00; H03L 1/026; G06F 1/0321
USPC .......................................... 342/118, 200, 109
See application file for complete search history.

(56) References Cited

U.S. PATENT DOCUMENTS

| 5,172,123 A | 12/1992 | Johnson |
| 5,799,534 A | 9/1998 | van der Pol |
| 2002/0158697 A1 | 10/2002 | Winter et al. |

(Continued)

FOREIGN PATENT DOCUMENTS

| CN | 103809159 A | 5/2014 |
| EP | 1 928 093 A1 | 6/2008 |

(Continued)

OTHER PUBLICATIONS

Partial Supplementary European Search Report dated Aug. 30, 2018 in Patent Application No. 15882622.2. 16 pages.

(Continued)

*Primary Examiner* — Bo Fan
(74) *Attorney, Agent, or Firm* — Oblon, McClelland, Maier & Neustadt, L.L.P.

(57) ABSTRACT

An FM-CW radar includes a high frequency circuit that receives a reflected wave from a target, and a signal processing unit that converts an analog signal generated by the high frequency circuit into a digital signal and detects at least a distance to the target and velocity of the target. The high frequency circuit includes a VCO that receives a modulation voltage from the signal processing unit and generates a frequency-modulated high frequency signal. The signal processing unit includes an LUT that stores default modulation control data. The signal processing unit calculates frequency information from phase information of output of the VCO, and updates the data stored in the LUT with correction data that is generated by using a result of the calculation.

14 Claims, 6 Drawing Sheets

(56) References Cited

U.S. PATENT DOCUMENTS

| | | |
|---|---|---|
| 2003/0117201 A1* | 6/2003 | Wang .................. H03B 27/00 327/254 |
| 2003/0184470 A1 | 10/2003 | Ishii et al. |
| 2003/0218431 A1* | 11/2003 | Roh ...................... G09G 3/288 315/169.1 |
| 2005/0165567 A1 | 7/2005 | Inatsune |
| 2007/0103354 A1 | 5/2007 | Inatsune |
| 2008/0061891 A1 | 3/2008 | Hongo |
| 2008/0100500 A1 | 5/2008 | Kondoh |
| 2009/0224845 A1 | 9/2009 | Suzuki |
| 2009/0224963 A1 | 9/2009 | Nakanishi |
| 2010/0245160 A1 | 9/2010 | Sakurai et al. |
| 2011/0227785 A1* | 9/2011 | Sakurai ................ G01S 13/345 342/200 |
| 2013/0050013 A1 | 2/2013 | Kobayashi et al. |
| 2017/0285139 A1 | 10/2017 | Higuchi et al. |

FOREIGN PATENT DOCUMENTS

| | | |
|---|---|---|
| EP | 2 600 520 A1 | 6/2013 |
| JP | 61-95602 A | 5/1986 |
| JP | 2-134723 U | 11/1990 |
| JP | 9-119977 A | 5/1997 |
| JP | 2003-294835 A | 10/2003 |
| JP | 2004-184185 A | 7/2004 |
| JP | 2007-298317 A | 11/2007 |
| JP | 2008-111743 A | 5/2008 |
| JP | 2008-298736 A | 12/2008 |
| JP | 2010-11483 A | 1/2010 |
| JP | 2010-237172 A | 10/2010 |
| JP | 2011-127923 A | 6/2011 |
| JP | 2011-196880 A | 10/2011 |
| JP | 2011-209046 A | 10/2011 |
| JP | 2013-47617 A | 3/2013 |
| JP | 2014-62824 A | 4/2014 |
| JP | 2014-185973 A | 10/2014 |
| WO | WO 01/79880 A1 | 10/2001 |
| WO | WO 2004/019496 A1 | 3/2004 |
| WO | WO 2005/081407 A1 | 9/2005 |
| WO | WO 2008/010298 A1 | 1/2008 |
| WO | WO 2016/051438 A1 | 4/2016 |

OTHER PUBLICATIONS

Japanese Office Action dated Dec. 26, 2017 in Japanese Patent Application No. 2017-500231, 5 pages (with unedited computer generated English translation).

International Search Report dated May 19, 2015 in PCT/JP2015/054687 filed Feb. 19, 2015.

Extended Search Report dated Jan. 3, 2019 in European patent Application No. 15882622.2.

Extended European Search Report dated May 27, 2019 in European Patent Application No. 16902316.5, 10 pages.

Office Action dated May 14, 2019 in corresponding Japanese Patent Application No. 2018-517939 (with English Translation), 10 pages.

Office Action Issued in corresponding Chinese Application No. 201580075892.4 dated Sep. 12, 2019. citing above AO reference (with English translation).

* cited by examiner

FM-CW RADAR AND METHOD OF GENERATING FM-CW SIGNAL

FIELD

The present invention relates to an FM-CW radar that uses frequency modulation based on a frequency modulated continuous waves (FM-CW) scheme, and to a method of generating an FM-CW signal that is transmitted by the FM-CW radar.

BACKGROUND

An FM-CW radar has the ease of configuration and a relatively low frequency of the baseband that facilitates signal processing, and is thus used commonly these days as a millimeter wave band collision avoidance radar or the like with the aim of reducing cost.

An FM-CW scheme uses an up-chirp signal that varies a transmit frequency from a low frequency to a high frequency and a down-chirp signal that varies the frequency from a high frequency to a low frequency, and calculates the distance to a target as well as relative velocity with respect to the target on the basis of a sum of peak frequencies and a difference in the peak frequencies of beat signals respectively obtained from the chirp signals.

On the other hand, transmit/receive modules making up the FM-CW radar require adjustment work in a delivery inspection process due to individual differences and temperature characteristics of voltage control oscillators (hereinafter noted as a "VCO"), and thus hinder reduction of the inspection time in mass production. Because no feedback control performed after shipment, there is a problem in that the radar is unable to respond to a change in the characteristics of the VCO caused by aging or the like.

Note that Patent Literature 1 discloses the configuration including: a frequency divider that divides, by the number of divisions N, an output signal from the VCO an oscillating frequency of which varies according to an analog control voltage; a digital phase detector that detects phase information from an output signal of the frequency divider and outputs digital phase information; and a differentiator that differentiates the digital phase information output from the digital phase detector and converts the information into digital frequency information.

CITATION LIST

Patent Literature

Patent Literature 1: Japanese Patent Application Laid-Open No. 2013-47617

SUMMARY

Technical Problem

Patent Literature 1 obtains the frequency information on the basis of the phase information included in the output of the VCO as described above, but does not disclose a specific method of generating the output of the VCO. A conventional technique has thus been unable to properly respond to the change in the characteristics of the VCO caused by aging or the like.

The present invention has been made in view of the aforementioned circumstances, where an object of the invention is to obtain an FM-CW radar capable of properly responding to a change in the characteristics of a VCO caused by aging or the like, and to obtain a method of generating an FM-CW signal.

Solution to Problem

There is provided an FM-CW radar according to an aspect of the present invention using frequency modulation based on an FM-CW scheme, the FM-CW radar including: a high frequency circuit to receive a reflected wave from a target; and a signal processing unit to convert an analog signal generated by the high frequency circuit into a digital signal and detect at least a distance to the target and velocity of the target, wherein the high frequency circuit includes a voltage control oscillator to generate a frequency-modulated high frequency signal by receiving a modulation voltage from the signal processing unit, the signal processing unit includes a look up table to store default modulation control data, and the signal processing unit calculates frequency information from phase information of output of the voltage control oscillator, and updates data stored in the look up table with correction data that is generated by using a result of the calculation.

Advantageous Effects of Invention

According to the present invention, the FM-CW radar can properly respond to the change in the characteristics of the VCO caused by aging or the like.

DESCRIPTION OF EMBODIMENTS

An FM-CW radar and a method of generating an FM-CW signal according to an embodiment of the present invention will now be described in detail with reference to the drawings. Note that the present invention is not to be limited by the following embodiment.

First Embodiment

Figure 1:
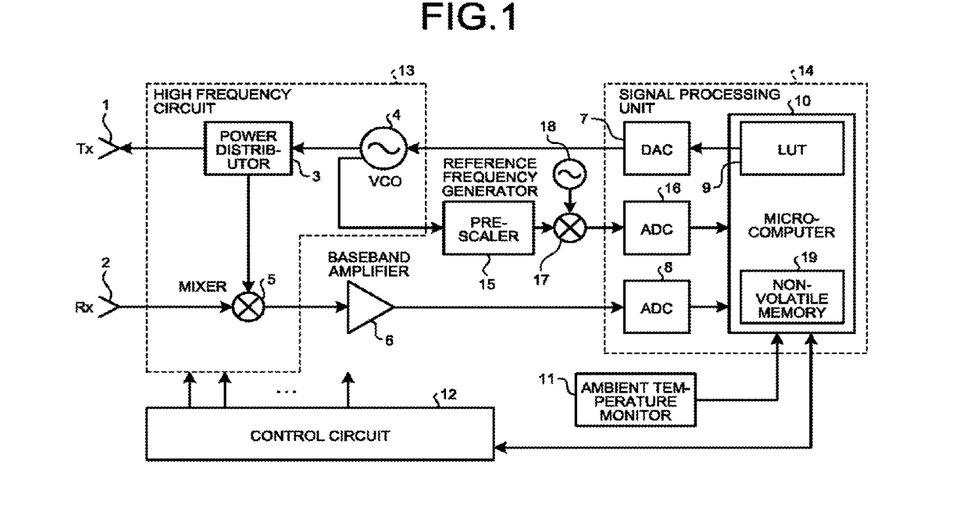
FIG. 1 is a block diagram illustrating the configuration of an FM-CW radar according to a first embodiment.

FIG. 1 is a block diagram illustrating the configuration of an FM-CW radar according to a first embodiment. The FM-CW radar according to the first embodiment is an FM-CW radar that uses frequency modulation based on an FM-CW scheme. As illustrated in FIG. 1, the FM-CW radar is made up of main components including: a high frequency circuit 13 that radiates a transmit signal as a radio wave into space via a transmitting antenna 1 (Tx) and receives, via a receiving antenna 2 (Rx), a reflected wave of the transmitted radio wave that is reflected from a target; a signal processing unit 14 that converts an analog signal output from the high frequency circuit 13 into a digital signal and detects the distance to the target as well as the velocity thereof and, if necessary, the bearing of the target; and a control circuit 12 that controls various control voltages supplied to the high frequency circuit 13.

The high frequency circuit 13 includes, as basic components: a VCO 4 that receives, as a transmit command, a VCO modulation voltage being a triangular wave voltage signal from the signal processing unit 14 and generates a frequency-modulated high frequency signal; a power distributor 3 that supplies most of the high frequency signal output from the VCO 4 to the transmitting antenna 1 and supplies the rest as a local signal; and a mixer 5 that receives the local signal and uses it to convert the frequency of a received signal from the receiving antenna 2 or, to be specific, down-convert the received signal. The components of the high frequency circuit 13 are each formed of a microwave monolithic IC (MMIC).

A baseband amplifier circuit 6, a prescaler 15, a mixer 17, and a reference frequency generator 18 are provided between the high frequency circuit 13 and the signal processing unit 14. The functions of these components will be described later. Note that the transmitting antenna 1, the receiving antenna 2, the baseband amplifier circuit 6, the control circuit 12, the high frequency circuit 13, the signal processing unit 14, the prescaler 15, the mixer 17, and the reference frequency generator 18 make up a millimeter wave transceiver module.

The signal processing unit 14 includes: a microcomputer 10 that is a main circuit unit mainly performing transmission processing and measurement processing of the FM-CW radar; a digital-to-analog converter (hereinafter noted as "DAC" as appropriate) 7 that converts the triangular wave voltage sign al being the transmit command from the microcomputer 10 into an analog signal and inputs the signal to the VCO 4 of the high frequency circuit 13; an analog-to-digital converter (hereinafter noted as "ADC" as appropriate) 8 that converts a received signal from the baseband amplifier circuit 6 into a digital signal and inputs the signal to the microcomputer 10; and an ADC 16, the function of which will be described in detail later on. Note that the microcomputer 10 includes a look up table (hereinafter noted as "LUT" as appropriate) 9 that stores data of the triangular wave voltage signal being input to the VCO 4. The FM-CW radar is further provided with an ambient temperature monitor 11 that monitors the ambient temperature, where a value detected by the ambient temperature monitor 11 is input to the microcomputer 10.

Under the control of the microcomputer 10, the control circuit 12 controls the various control voltages supplied to the MMICs in the high frequency circuit 13. The microcomputer 10 is provided with a non-volatile memory 19. The MMICs in the high frequency circuit 13 vary depending or, a production lot. The non-volatile memory 19 in the microcomputer 10 thus stores a control voltage value that is individually adjusted and determined for each product of the millimeter wave transceiver module. In the actual operation, the control voltage value is read from the non-volatile memory 19 by the microcomputer 10 and supplied to the MMICs in the high frequency circuit 13 via the control circuit 12.

The VCO 4 receives the VCO modulation voltage being the triangular wave voltage signal from the signal processing unit 14 and generates an FM-CW signal that is a high frequency signal including an up modulation signal which is shifted up in frequency within a certain period of time, and a down modulation signal which is shifted down in frequency within a certain period of time. Most of the FM-CW signal being generated is supplied from the power distributor 3 to the transmitting antenna 1, and the transmitting antenna 1 radiates millimeter waves toward a target. The rest of the FM-CW signal, namely a portion not supplied to the transmitting antenna 1, is supplied as a local signal to the mixer 5.

A reflected wave reflected from the target that is captured by the receiving antenna 2 is input to the mixer 5 as a received signal. The mixer 5 mixes the received signal from the receiving antenna 2 and the local signal from the power distributor 3 to output a beat signal with a frequency corresponding to a difference in the frequencies of the two signals. The beat signal is amplified to an appropriate level in the baseband amplifier circuit 6 and then input to the microcomputer 10 via the ADC 8. The microcomputer 10 obtains the distance to the target as well as the relative velocity with respect to the target and, if necessary, the bearing of the target on the basis of the frequency of the input beat signal during each of a period in which the frequency is shifted up and a period in which the frequency is shifted down.

Here, the frequency of a frequency-divided signal from the VCO 4 is decreased to a fraction of a certain integer by the prescaler 15 and then input to the mixer 17. The mixer 17 mixes an output signal from the prescaler 15 and the local signal from the reference frequency generator 18 to output a signal with a frequency corresponding to a difference in the frequencies of the two signals. The output signal from the mixer 17 is input to the microcomputer 10 via the ADC 16 and is used to update the data on the triangular wave voltage signal stored in the LUT 9.

Figure 2:
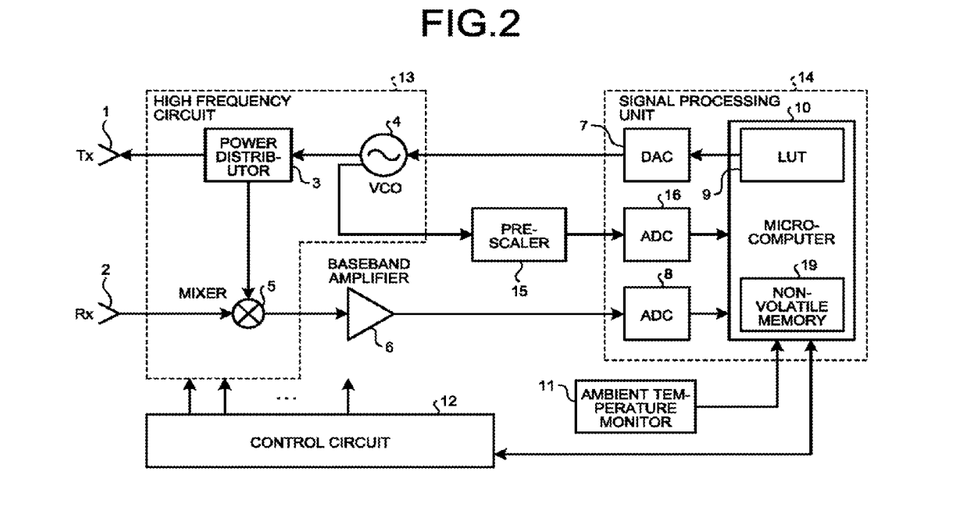
FIG. 2 is a block diagram illustrating the configuration of the FM-CW radar according to the first embodiment, where some components are omitted.

FIG. 2 illustrates another possible configuration not using the mixer 17 or the reference frequency generator 18 used in FIG. 1. FIG. 2 illustrates the configuration where the frequency band of a signal input to the ADC 16 is the frequency band of a signal output from the prescaler 15. Although this requires a faster processing clock than the ADC 16 used in FIG. 1, the advantage of not using the mixer 17 or the reference frequency generator 18 can effectively reduce cost and improve reliability of the millimeter wave transceiver module.

Figure 3:
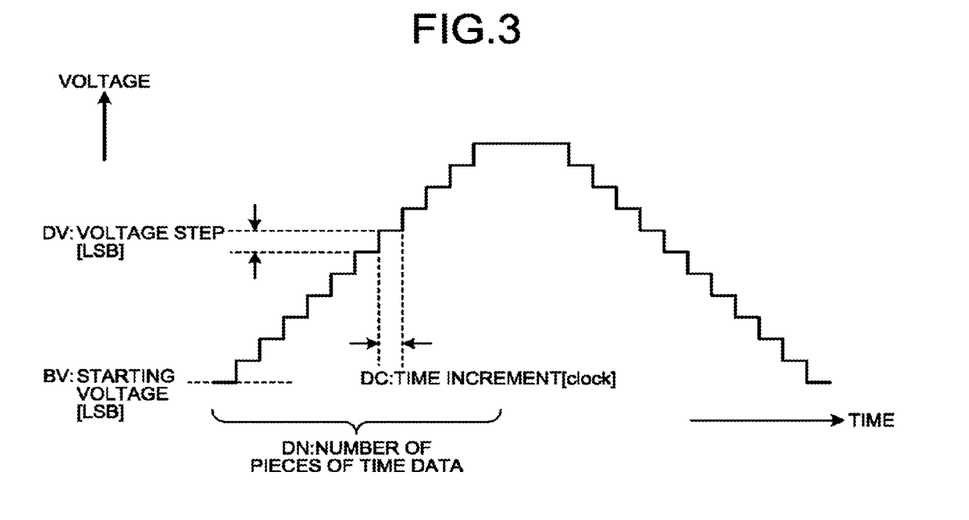
FIG. 3 is a diagram provided for explaining parameters that make up modulation control data stored in an LUT.
Figure 4:
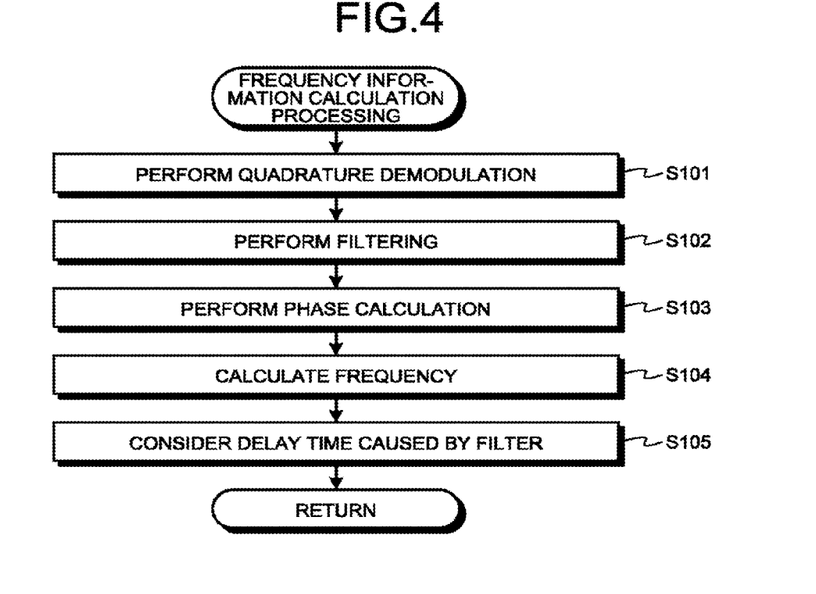
FIG. 4 is a flowchart illustrating the flow of frequency information calculation processing performed by a microcomputer.
Figure 5:
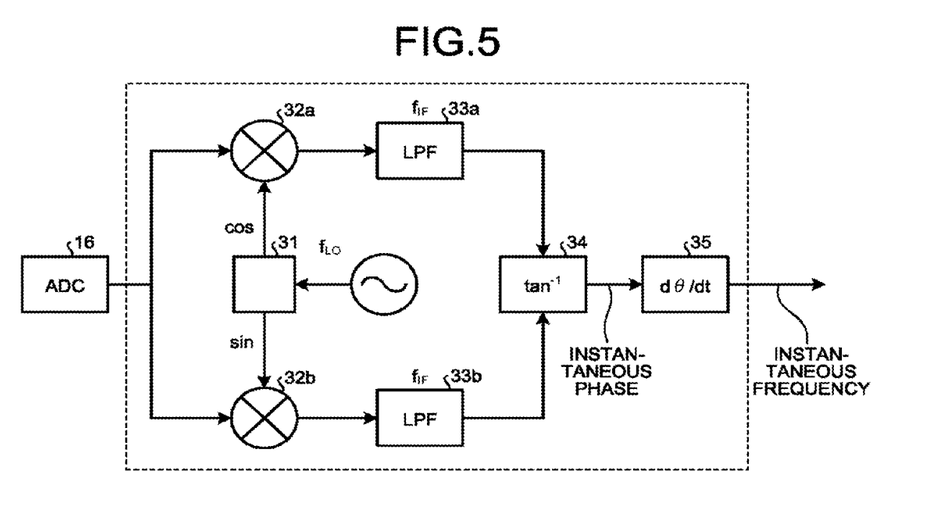
FIG. 5 is a block diagram illustrating the calculation flow of the processing illustrated in FIG. 4 when the processing is performed by a dedicated processor.
Figure 6:
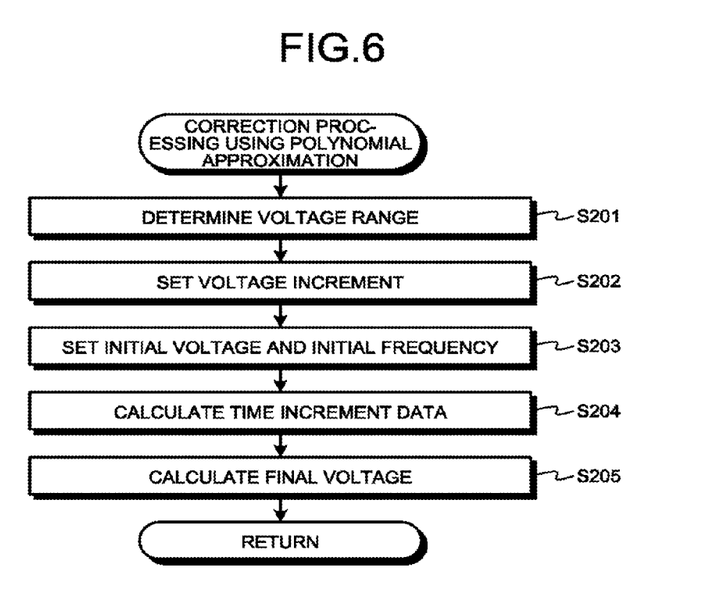
FIG. 6 is a flowchart illustrating the flow of correction processing using a polynomial approximation.
Figure 7:
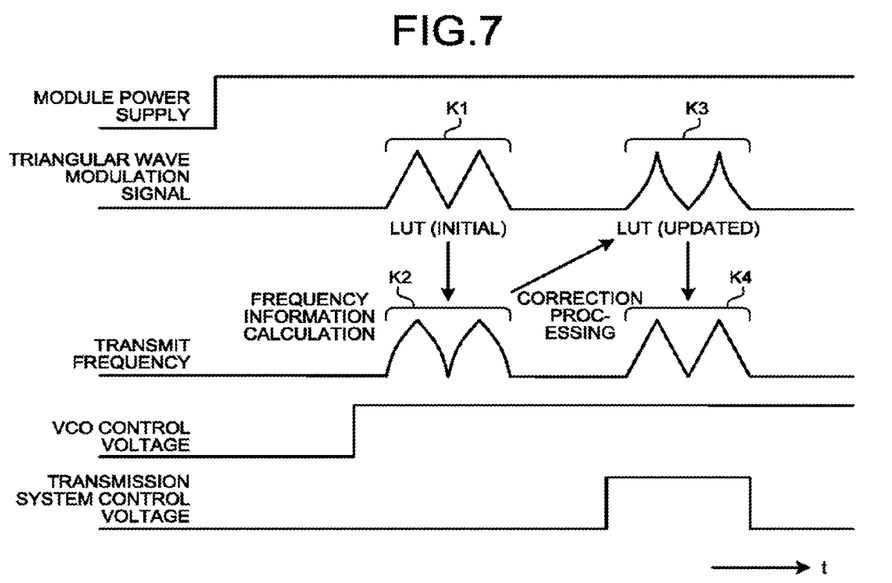
FIG. 7 is a timing diagram provided for explaining an update of the LUT and transmission processing performed after the update.

Main parts of the FM-CW radar according to the first embodiment will now be described with reference to FIGS. 1 and 3 to 7. FIG. 3 is a diagram provided for explaining parameters that make up modulation control data stored in the LUT 9. FIG. 4 is a flowchart illustrating the flow of frequency information calculation processing performed by the microcomputer 10. FIG. 5 is a block diagram illustrating the calculation flow of the processing illustrated in FIG. 4 when the processing is performed by a dedicated processor. FIG. 6 is a flowchart illustrating the flow of correction processing using a polynomial approximation. FIG. 7 is a timing diagram provided for explaining an update of the LUT and transmission processing performed after the update.

The modulation control data store in the LUT 9 will be described first with reference to FIG. 3. The modulation control data is formed of a voltage step DV, a starting voltage BV, a time increment DC, and the number of pieces of time data DN. The diagram in FIG. 3 has a horizontal axis representing time and a vertical axis representing a voltage value. The time increment DC and the number of pieces of time data DN are parameters along the time axis, whereas the starting voltage BV and the voltage step DV are parameters along the voltage axis. A more detailed description will now be provided.

(Voltage Step DV)

The voltage step DV is set to an integer multiple of the voltage resolution of the DAC 7 and is basically fixed. The DAC 7 with a reference voltage of 5 V and resolution of 10 bit has the voltage resolution of 5/1024=0.00488 V, for example.

(Starting Voltage BV)

The starting voltage BV is a starting voltage of the modulation control data and is set to an integer multiple of the voltage resolution of the DAC 7, as is the case with the voltage step DV.

(Time Increment DC)

The time increment DC is a duration of a certain voltage value and is set to an integer multiple of the minimum time resolution of the microcomputer 10. The time increment DC essentially controls the waveform. Note that the time increment DC has a fixed value in default chirp data that is stored in the LUP 9 as a default.

(Number of Pieces of Time Data DN)

The number of pieces of time data DN is a cumulative value of the time increments DC in any single section and indicates the number of pieces of data in the single section.

Note that in order to increase the accuracy of correction, the present embodiment forms a desired waveform by fixing the value of the voltage step DV and varying the time increment DC. It is needless to say that the voltage step DV may be variable, not fixed.

The frequency information calculation processing will now be described with reference to FIGS. 4 and 5.

(Quadrature Demodulation)

Quadrature demodulation corresponds to processing in step S101 of FIG. 4 as well as processing by a sine function and cosine function generator 31 and multipliers 32a, 32b in FIG. 5. Specifically, a piece of data sampled from the ADC 16 is subjected to quadrature detection and separated into two signals including an in-phase (I) component and a quadrature (Q) component. These I component and Q component signals are expressed by the following expression.

[Expression 1]

$$I(n) = x(n) \cdot \sin(\omega \cdot \Delta t \cdot n) \, n=1,2,\ldots,k$$

$$Q(n) = x(n) \cdot \cos(\omega \cdot \Delta t \cdot n) \quad (1)$$

x(n): Digital data acquired by sampling
k: The number of samples
$\Delta t$: Sampling interval
$\omega = 2\pi f_{Lo}$ ($f_{Lo}$: Lo frequency for quadrature demodulation)

(Filtering)

Filtering corresponds to processing in step S102 of FIG. 4 and processing by low pass filters (hereinafter noted as "LPF") 33a and 33b in FIG. 5. Note that in the present embodiment, the filtering is performed to multiply the I signal and the Q signal acquired by the quadrature demodulation in step S101 by corresponding weighting factors according to finite impulse response (FIR) filters, respectively. The FIR filtering can be expressed by the following expression. Not only the FIR filter but an infinite impulse response (IIR) filter may be used in the filtering.

[Expression 2]

$$I'(n) = \sum_{l=0}^{L-1} a_1 \cdot I(n-1) \quad (2)$$

$$Q'(n) = \sum_{l=0}^{L-1} a_1 \cdot Q(n-1)$$

(Phase Calculation)

Phase calculation corresponds to processing in step S103 of FIG. 4 and processing by an arctangent function calculator 34 in FIG. 5. The processing in step S103 is performed to generate an instantaneous phase $\theta$ (n) expressed by the following expression.

[Expression 3]

$$\theta(n) = \tan^{-1}\frac{Q'(n)}{I'(n)} \quad (3)$$

(Frequency Calculation)

Frequency calculation corresponds to processing in step S104 of FIG. 4 and processing by a frequency calculator 35 in FIG. 5. The processing in step S104 generates an instantaneous frequency f″ (n) expressed by the following expression.

[Expression 4]

$$f''(n) = \frac{1}{2n} \cdot \frac{\theta(n+1) - \theta(n)}{\Delta t} \quad (4)$$

Those calculations yield a relationship between the time and the frequency. The acquired frequency is then converted into a value in the 76 to 77 GHz band by the following conversion expression.

[Expression 5]

$$f'(n) = \{f''(n) + f_{xo}\} \cdot N \cdot 4$$

$f_{xo}$: Local oscillator frequency (generated by reference frequency generator)

N: Division number of prescaler (5)

The above expression (5) applies to the case where a local oscillator signal frequency $f_{xo}$ of the reference frequency generator 18 is 19 GHz, or where the frequency-divided signal from the VCO 4 is monitored in the 19 GHz band.

(Considering Delay Time Caused by Filter)

Consideration of a delay time caused by the filter corresponds to processing in step S105 of FIG. 4. Regarding the relationship between the time and the frequency acquired through the processing in steps S101 to S104, the processing in step S105 is performed to shift the frequency data while taking into consideration the delay time caused by the FIR filter. Specifically, shift processing as expressed by the following expression is performed in step S105.

[Expression 6]

$$f(n)=f'(n+t_{d1}) \tag{6}$$

Correction processing using a polynomial approximation will now be described. The frequency information calculated by the flow of the "frequency information calculation processing" illustrated in FIG. 4 is stored as frequency data with respect to time into the non-volatile memory 19 of the microcomputer 10. The modulation control data described with reference to FIG. 3 is already stored in the LUT 9 of the microcomputer 10 as voltage data with respect to time. The correction processing using a polynomial approximation in this case uses a polynomial to approximate the relationship between the voltage and the frequency while referring to the "frequency data with respect to time" and the "voltage data with respect to time". A piece of modulation data required to obtain linearity of the frequency is generated on the basis of an approximation function obtained by the polynomial approximation, and is applied to the LUT 9 as modulation control data to be output to a next period. That is, the approximation function obtained by the polynomial approximation is used to update the modulation control data stored in the LUT 9.

Next, an example of the correction processing using a polynomial approximation will be described with reference to FIG. 6. Note that the example in FIG. 6 uses, as preconditions, the 10-bit DAC 7 and a quadratic function as a function used in the polynomial approximation.

(Determining Voltage Range)

Determination of a voltage range corresponds to processing in step S201 of FIG. 6. Specifically, the frequency is expressed as a quadratic function of the voltage as expressed by the following expression, where a center frequency fc corresponding to a center voltage Vc is obtained to then set a starting frequency fmin as well as a starting voltage Vmin for a required modulation width Δf.

[Expression 7]

$$\begin{aligned}
f &= aV^2 + bV + c \\
f_c &= aV_c^2 + bV_c + c \\
f_{min} &= f_c - \frac{\Delta f}{2} \\
V_{min} &= \frac{-b + \sqrt{b^2 - 4a(c - f_{min})}}{2a}
\end{aligned} \tag{7}$$

(Setting Voltage Increment)

Setting of a voltage increment corresponds to processing in step S202 of FIG. 6. Specifically, the voltage step DV is set to a fixed value.

(Setting Initial Voltage and Initial Frequency)

Setting of an initial voltage and an initial frequency corresponds to processing in step S203 of FIG. 6. Specifically, an initial voltage $V_0$ is obtained by rounding the starting voltage Vmin obtained by expression (7) to a value that the DAC 7 can have for every voltage increment. Such value then serves as a starting voltage BV. An initial frequency $f_0$ is a frequency corresponding to $V_0$. The initial frequency is obtained by the following expression.

[Expression 8]

$$f_0 = aV_0^2 + bV_0 + c \tag{8}$$

(Calculating Time Increment Data)

Calculation of time increment data corresponds to processing in step S204 of FIG. 6. Target frequency data can be expressed by the following expression. Note that a represents a theoretical slope of a frequency obtained from a modulation width and prescribed time.

[Expression 9]

$$f = \alpha t + f_0 \tag{9}$$

An expression for calculating time can be expressed by the following expression on the basis of expression (9) and the quadratic approximation (first expression) in expression (7).

[Expression 10]

$$t = (aV^2 + bV + c - f_0)/\alpha \tag{10}$$

Note that the voltage with the initial voltage of $V_0$ is incremented by one step at a time. The time obtained is quantized by the minimum time resolution of the microcomputer 10 to be expressed.

(Calculating Final Voltage)

Calculation of a final voltage corresponds to processing in step S205 of FIG. 6. Specifically, the final voltage is calculated up to where a cumulative time of the time increment data calculated in step S204 does not exceed the prescribed time. The number of pieces of the time increments DC acquired is the number of pieces of time data DN. Note that with the initial voltage $V_0$, a final voltage Ve can be calculated by the following expression.

[Expression 11]

$$Ve = Vo + DV \cdot DN \tag{11}$$

Next, an update of the LUT and transmission processing performed after the update according to the first embodiment will be described with reference to a timing diagram in FIG. 7. The timing diagram in FIG. 7 has a horizontal axis representing time and a vertical axis representing, from the top, an on state of a module power supply, a triangular wave modulation signal, a transmit frequency, a VCO control voltage, and a transmission system control voltage.

The LUT 9 stores predetermined data as a default of the modulation control data. The predetermined data is referred to as default chirp data. FIG. 7 indicates the default chirp data by a waveform K1 of the triangular wave modulation signal. When there is no change in the characteristics of the VCO 4, the frequency of the FM-CW signal transmitted from the transmitting antenna 1 has a waveform as indicated by a waveform K4 with linearity. On the other hand, when there occurs a change in the characteristics of the VCO 4 due to aging or the like, the frequency of the FM-CW signal transmitted from the transmitting antenna 1 has a waveform as indicated by a waveform K2 without linearity. Because of the above, the first embodiment converts the frequency-divided signal from the VCO 4 into a digital signal to monitor the signal on a regular basis, and at the same time calculates the frequency information from the phase information of the frequency-divided signal from the VCO 4 (the processing flow in FIG. 4). A result of the calculation is used to perform the correction processing and calculate voltage data that is required for ensuring the linearity of the transmit frequency (the processing flow in FIG. 6). After the processing in FIG. 6, the data stored in the LUT 9 is updated to data as indicated by a waveform K3, which is then applied to the waveform K2 to be able to generate the FM-CW signal that has the waveform with linearity as indicated by the waveform K4.

The FM-CW signal is not transmitted until a first round of the update of the LUT 9 is completed by calculating the frequency information and performing the correction processing. In this case, the frequency calculation and correction processing are performed after turning on the module power supply and then the VCO control voltage as illustrated in FIG. 7, whereas transmission of the FM-CW signal can be inhibited by keeping the transmission system control voltage off. The transmission system control voltage may be turned on in synchronization with the update of the LUT 9 to enable transmission of the FM-CW signal quickly after the update of the LUT 9.

As described above, the first embodiment calculates the frequency information from the phase information of the frequency-divided signal output from the VCO 4, and updates the data stored in the LUT 9 with correction data that is generated by using the result of the calculation, whereby the radar can properly respond to the change in the characteristics of the VCO caused by aging or the like. The ability to properly respond to the change in the characteristics of the VCO allows a reduction in the inspection time required in a delivery inspection process as well as construction of a mechanism of feedback control after the shipment, thereby allowing the VCO correction to be performed with higher accuracy.

Second Embodiment

In the first embodiment, the LUT 9 is updated by the combination of the frequency calculation processing based on the phase calculation and the correction processing using the polynomial approximation. In a second embodiment, correction processing based on time error calculation is substituted for second and subsequent rounds of updating an LUT 9. A basic configuration is identical or equivalent to the configuration of the first embodiment illustrated in FIG. 1 or 2, and thus a description of a specific configuration will be omitted.

Figure 8:
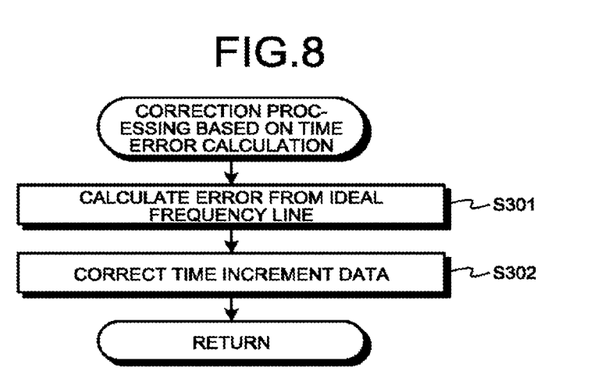
FIG. 8 is a flowchart illustrating the flow of correction processing based on time error calculation performed by a microcomputer.
Figure 9:
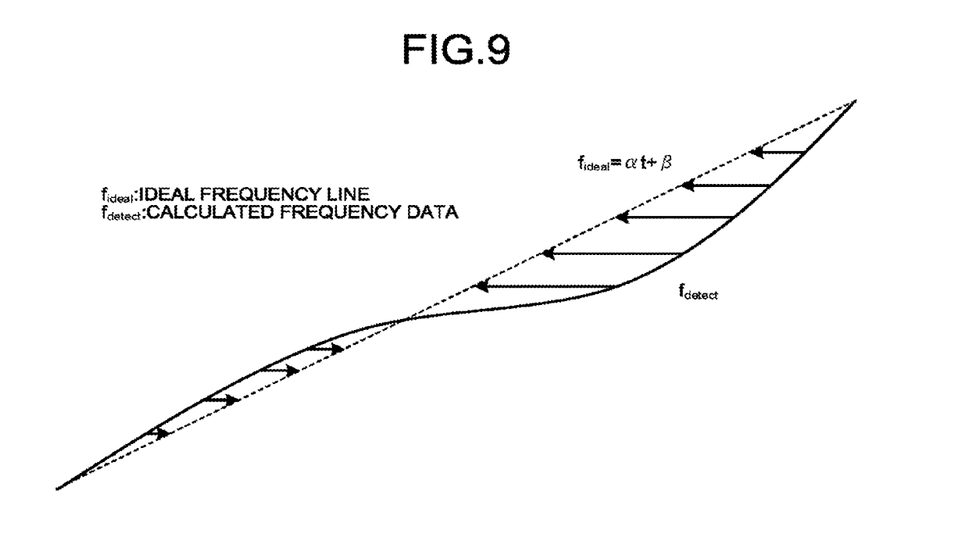
FIG. 9 is a diagram provided for explaining the concept of the correction processing based on the time error calculation.

Main parts of an FM-CW radar according to the second embodiment will now be described with reference to FIGS. 8 and 9. FIG. 8 is a flowchart illustrating the flow of the correction processing based on time error calculation performed by a microcomputer 10. FIG. 9 is a diagram provided for explaining the concept of the "correction processing based on time error calculation".

(Calculating Error from Ideal Frequency Line)

Calculation of an error from an ideal frequency line corresponds to processing in step S301 of FIG. 8. Specifically, "frequency data with respect to time" is calculated first according to the flow of "frequency information calculation processing" illustrated in FIG. 4. Then, an error $\delta t(i)$ between the "frequency data with respect to time" and the ideal frequency line is calculated on the basis of the following expression.

[Expression 12]

$$\delta t(i) = \frac{f_{detect}(i) - f_{ideal}(i)}{\alpha} \quad (12)$$

In expression (12), $f_{ideal}$ represents the ideal frequency line, and $f_{detect}$ represents the frequency data calculated by the flow of FIG. 4. Moreover, $\alpha$ represents a theoretical slope value of the frequency obtained from a modulation width and prescribed time. FIG. 9 illustrates an image of such calculation, where an arrow component between the waveform of the frequency data $f_{detect}$, indicated by a solid waveform and the waveform of the ideal frequency line $f_{ideal}$ is calculated as the error, the arrow component corresponding to a difference between the waveforms along a time axis.

(Correcting Time Increment Data)

Correction of time increment data corresponds to processing in step S302 of FIG. 8. Specifically, a time increment DC is corrected by using the error from the ideal frequency line that is calculated by expression (12). Where the beginning of the data range is denoted as k-th, the time increment DC after correction can be obtained by the following expression.

[Expression 13]

k-th calculation: $DC'(k)=DC(k)+\delta t(k)$ (k+1)-th and subsequent calculation: $DC'(k+1)=DC(k+1)+\delta t(k+1)-\delta t(k)$ \quad (13)

In expression (13), DC (k) represents k-th data before correction, $\delta t$ (k) represents an error component obtained by using DC (k), and DC' (k) represents k-th data after correction. Likewise, DC (k+1) represents (k+1)-th data before correction, $\delta t$ (k+1) represents an error component obtained by using DC (k+1), and DC' (k+1) represents (k+1)-th data after correction.

The LUT 9 of the second embodiment is updated as follows according to the flow of FIG. 8. In a first round of updating the LUT 9, a frequency characteristic of default chirp data is subjected to a polynomial approximation (the quadratic approximation in the aforementioned example) and, from a result of the approximation, a voltage table required to secure linearity is calculated. In second and subsequent rounds of updating the LUT 9, a time error with respect to the ideal frequency line is calculated according to the flow in FIG. 8 instead of using the polynomial approximation, and then the time error is used to correct each time data.

The second embodiment as described above is adapted to calculate, as the error, the difference along the time axis between the calculated frequency information data and the waveform data of the ideal frequency line, and use the calculated error to perform the correction along the time axis to thus be able to obtain an effect similar to that of the first embodiment.

Third Embodiment

In a third embodiment, an indication of a change in characteristics of a VCO caused by a change in ambient temperature is perceived to result in an additional function of detecting an abnormality in a transmit frequency of an FM-CW radar and issuing an alarm and an error. A basic configuration is identical or equivalent to the configuration of the first embodiment illustrated in FIG. 1 or 2, and thus a description of a specific configuration will be omitted.

Figure 10:
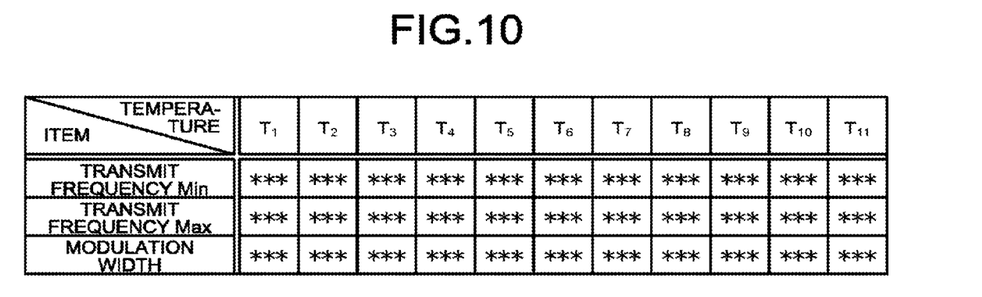
FIG. 10 is a table illustrating the image of data stored in a non-volatile memory of a microcomputer.
Figure 11:
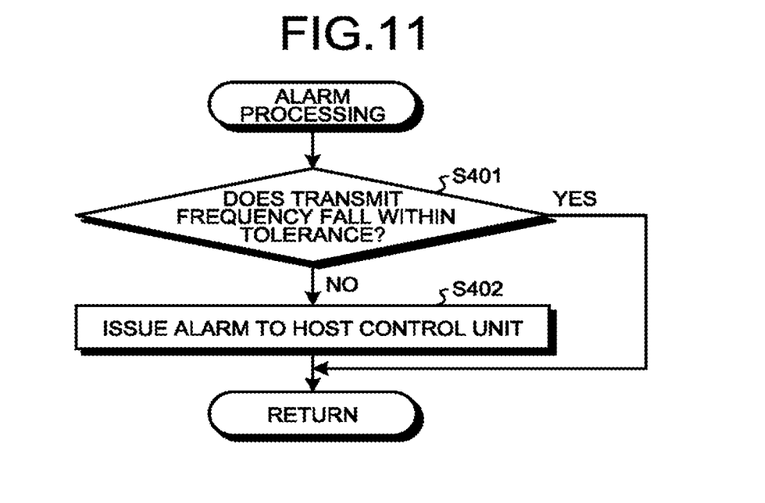
FIG. 11 is a flowchart illustrating the flow of alarm processing according to a third embodiment.
Figure 12:
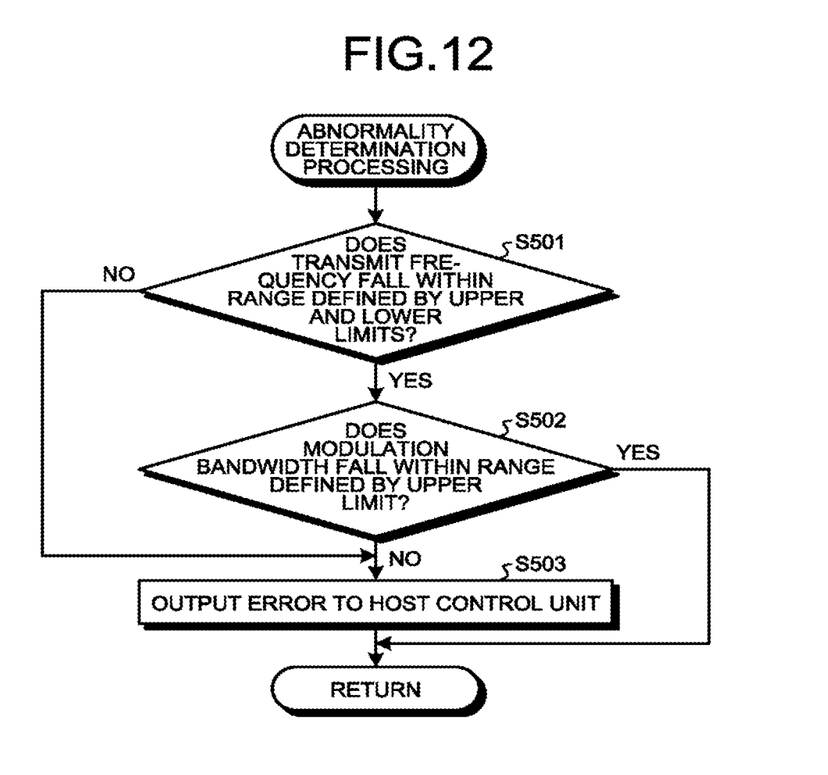
FIG. 12 is a flowchart illustrating the flow of abnormality determination processing according to the third embodiment.

Main parts of the FM-CW radar according to the third embodiment will now be described with reference to FIGS. 10 to 12. FIG. 10 is a table illustrating the image of data stored in a non-volatile memory 19 of a microcomputer 10. FIG. 11 is a flowchart illustrating the flow of "alarm processing" according to the third embodiment. FIG. 12 is a flowchart illustrating the flow of "abnormality determination processing" according to the third embodiment.

An ambient temperature monitor 11 monitors the ambient temperature of a transceiver module on a regular basis. Temperature data obtained by the ambient temperature monitor 11 is stored in the non-volatile memory 19 along with the transmit frequency that is a frequency of a transmit signal of an FM-CW signal.

According to the flow of the alarm processing in FIG. 11, it is first determined whether or not the transmit frequency falls within a preset tolerance (step S401). The transmit frequency falling outside the preset tolerance (Ho in step S401) leads to a determination that there is an indication of deterioration, and an alarm is issued to a host control unit (step S402). No alarm is issued if the transmit frequency falls within the present tolerance (Yes in step S401).

The non-volatile memory 19 stores the transmit frequency information along with the ambient temperature data, thereby allowing one to check whether the transmit frequency deviates from a prescribed value and, in short, allowing one to issue the alarm to the host control unit.

Note that the non-volatile memory can store a limited number of data and may thus hold data at predetermined temperature intervals and, when not holding data on a temperature concerned, obtain a value of the temperature concerned by a linear approximation.

The processing flow in FIG. 11 determines whether or not the frequency of the transmit signal falls within the tolerance, whereas a processing flow in FIG. 12 may be executed to determine compliance with the Radio Act. Note that the processing flows in FIGS. 11 and 12 can coexist.

In the execution of the processing flow in FIG. 12, a transmit frequency Max that is an upper limit of the transmit frequency stipulated by the Radio Act, a transmit frequency Min that is a lower limit of the transmit frequency being stipulated, and a modulation width of a transmit radar signal are stored in the non-volatile memory 19 together with the temperature data obtained by the ambient temperature monitor 11, as illustrated in FIG. 10.

According to the flow of the abnormality determination processing in FIG. 12, it is first determined whether or not the transmit frequency falls within the range defined by the upper and lower limits (step S501). The transmit frequency falling outside the range defined by the upper and lower limits (No in step S501) leads to a determination that an abnormality is generated, and an error is issued to the host control unit (S503). Even when the transmit frequency falls within the range defined by the upper and lower limits (Yes in S501), it is further determined whether or not a modulation bandwidth of the FM-CW signal falls within a range defined by an upper limit (step S502). Then if the modulation bandwidth falls outside the range defined by the upper limit (No in step S502), an error is output to the host control unit (step S503).

It is needless to say that an action such as stopping the output of transmission is taken when the error is issued to the host control unit.

In the third embodiment described above, the ambient temperature of the transceiver module including a high frequency circuit 13 is monitored and stored into the non-volatile memory 19 along with the transmit frequency of the FM-CW signal, whereby an effect that the alarm processing and the abnormality determination processing can be performed is obtained in addition to the effect of the first embodiment.

The configuration illustrated in the aforementioned embodiment merely illustrates an example of the content of the present invention, and can thus be combined with another known technique or partially omitted and/or modified without departing from the gist of the present invention.

The processing in the first embodiment may be combined with the processing in the second embodiment, for example.

Alternatively, the processing in the first embodiment may be combined with the processing in the third embodiment, or the processing in the second embodiment may be combined with the processing in the third embodiment. Still alternatively, the processing in the first to third embodiments may all be combined.

REFERENCE SIGNS LIST 1 transmitting antenna (Tx), 2 receiving antenna (Rx), 3 power distributor, 5, 17 mixer, 6 baseband amplifier circuit, 7 digital-to-analog converter (DAC), 8, 16 analog-to-digital converter (ADC), 9 look up table (LUT), 10 microcomputer, 11 ambient temperature monitor, 12 control circuit, 13 high frequency circuit, 14 signal processing unit, 15 prescaler, 18 reference frequency generator, 19 non-volatile memory, 31 sine function and cosine function generator, 32a, 32b multiplier, 34 arctangent function calculator, 35 frequency calculator.

The invention claimed is:

1. An FM-CW (frequency modulated continuous waves) radar using frequency modulation based on an FM-CW scheme, the FM-CW radar comprising:
   high frequency circuitry configured to receive a reflected wave from a target; and
   signal processing circuitry configured to convert an analog signal generated by the high frequency circuitry into a digital signal and detect at least a distance to the target and velocity of the target, wherein
   the high frequency circuitry includes a voltage control oscillator to generate a frequency-modulated high frequency signal by receiving a modulation voltage from the signal processing circuitry,
   the signal processing circuitry includes a look up table to store default modulation control data, and
   the signal processing circuitry updates data stored in the look up table in response to change to characteristics of the voltage control oscillator with correction data that is generated by fixing a voltage increment and varying a time increment with use of frequency information calculated from phase information of an output of the voltage control oscillator, wherein
   the corrected modulation control data causes the voltage control oscillator to generate a linear frequency-modulated high frequency signal.

2. The FM-CW radar according to claim 1, wherein the FM-CW radar does not transmit an FM-CW signal until a first round of updating the look up table is completed by calculating the frequency information and performing correction processing.

3. The FM-CW radar according to claim 1, wherein the signal processing circuitry uses a polynomial approximation to correct the frequency information calculated by phase calculation.

4. The FM-CW radar according to claim 3, wherein the signal processing circuitry calculates, as an error, a difference along a time axis between data of the frequency information being calculated and waveform data of an ideal frequency line, and uses the calculated error to perform a correction along the time axis by using the calculated error and changing the time increment set to an integer multiple of the minimum time resolution of the signal processing circuitry.

5. The FM-CW radar according to claim 2, wherein the signal processing circuitry includes a non-volatile memory, and the signal processing circuitry monitors ambient temperature of a transceiver module including the high frequency circuitry, and stores temperature data obtained by monitoring into the non-volatile memory along with a transmitted frequency of the FM-CW signal.

6. The FM-CW radar according to claim 5, wherein the signal processing circuitry uses the temperature data stored in the non-volatile memory to determine whether or not the transmitted frequency falls within a preset tolerance, and issues an alarm to a host control circuitry in response to the transmitted frequency falling outside the tolerance.

7. The FM-CW radar according to claim 5, wherein the signal processing circuitry uses the temperature data stored in the non-volatile memory to determine whether or not the transmitted frequency falls within a range defined by an upper limit and a lower limit, or whether or not a modulation bandwidth of the FM-CW signal falls within a range defined by an upper limit, and issues an error to a host control circuitry in response to the transmitted frequency falling outside the range defined by the upper limit and the lower limit or the modulation bandwidth falling outside the range defined by the upper limit.

8. A method of generating an FM-CW (frequency modulated continuous waves) signal to be transmitted from an FM-CW radar, the FM-CW radar including: high frequency circuitry configured to include a voltage control oscillator generating a frequency-modulated high frequency signal, and signal processing circuitry configured to convert an analog signal generated by the high frequency circuitry into a digital signal and detect at least a distance to a target and velocity of the target, wherein the signal processing circuitry includes a look up table to store default modulation control data, the method including:
calculating frequency information from phase information of a frequency-divided signal from the voltage control oscillator;
performing correction processing in response to change to characteristics of the voltage control oscillator by fixing a voltage increment and varying a time increment by using a result of the calculation of the frequency information and then calculating voltage data required to secure linearity of a transmitted frequency; and
updating a value stored in the look up table by using the voltage data calculated in the correction processing.

9. An FM-CW (frequency modulated continuous waves) radar using frequency modulation based on an FM-CW scheme, the FM-CW radar comprising:
high frequency circuitry configured to receive a reflected wave from a target; and
signal processing circuitry configured to convert an analog signal generated by the high frequency circuitry into a digital signal and detect at least a distance to the target and velocity of the target, wherein
the high frequency circuitry includes a voltage control oscillator to generate a frequency-modulated high frequency signal by receiving a modulation voltage from the signal processing circuitry,
the signal processing circuitry includes a look up table to store default modulation control data, and
the signal processing circuitry updates data stored in the look up table with correction data that is generated by fixing a voltage increment and varying a time increment with use of frequency information calculated from phase information of an output of the voltage control oscillator, and wherein
the FM-CW radar does not transmit an FM-CW signal until a first round of updating the look up table is completed by calculating the frequency information and performing correction processing.

10. The FM-CW radar according to claim 9, wherein the signal processing circuitry uses a polynomial approximation to correct the frequency information calculated by phase calculation.

11. The FM-CW radar according to claim 10, wherein the signal processing circuitry calculates, as an error, a difference along a time axis between data of the frequency information being calculated and waveform data of an ideal frequency line, and uses the calculated error to perform a correction along the time axis by using the calculated error and changing the time increment set to an integer multiple of the minimum time resolution of the signal processing circuitry.

12. The FM-CW radar according to claim 9, wherein
the signal processing circuitry includes a non-volatile memory, and
the signal processing circuitry monitors ambient temperature of a transceiver module including the high frequency circuitry, and stores temperature data obtained by monitoring into the non-volatile memory along with a transmitted frequency of the FM-CW signal.

13. The FM-CW radar according to claim 12, wherein the signal processing circuitry uses the temperature data stored in the non-volatile memory to determine whether or not the transmitted frequency falls within a preset tolerance, and issues an alarm to a host control circuitry in response to the transmitted frequency falling outside the tolerance.

14. The FM-CW radar according to claim 12, wherein the signal processing circuitry uses the temperature data stored in the non-volatile memory to determine whether or not the transmitted frequency falls within a range defined by an upper limit and a lower limit, or whether or not a modulation bandwidth of the FM-CW signal falls within a range defined by an upper limit, and issues an error to a host control circuitry in response to the transmitted frequency falling outside the range defined by the upper limit and the lower limit or the modulation bandwidth falling outside the range defined by the upper limit.

* * * * *